(12) United States Patent
Su et al.

(10) Patent No.: US 11,380,736 B2
(45) Date of Patent: Jul. 5, 2022

(54) DISPLAY PANEL AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Qiujie Su, Beijing (CN); Zhihua Sun, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 145 days.

(21) Appl. No.: 17/016,511

(22) Filed: Sep. 10, 2020

(65) Prior Publication Data
US 2021/0074774 A1    Mar. 11, 2021

(30) Foreign Application Priority Data
Sep. 10, 2019 (CN) .......................... 201910856067.8

(51) Int. Cl.
*H01L 27/32* (2006.01)
*G02F 1/1333* (2006.01)
*G02F 1/1362* (2006.01)

(52) U.S. Cl.
CPC ...... *H01L 27/3213* (2013.01); *H01L 27/3276* (2013.01)

(58) Field of Classification Search
CPC ............. H01L 27/3213; H01L 27/3276; G02F 1/1333
See application file for complete search history.

(56) References Cited

U.S. PATENT DOCUMENTS

| 10,564,489 | B2* | 2/2020 | Matsushima | ..... G02F 1/134309 |
| 2010/0164851 | A1* | 7/2010 | Wang | ................ G02F 1/136213 |
| | | | | 345/98 |

(Continued)

FOREIGN PATENT DOCUMENTS

| CN | 108196411 A | 6/2018 |
| CN | 108227267 A | 6/2018 |
| KR | 20170126055 A | 11/2017 |

OTHER PUBLICATIONS

First Office Action, including Search Report, for Chinese Patent Application No. 201910856067.8, dated Oct. 9, 2021, 14 pages.

*Primary Examiner* — Mohsen Ahmadi
(74) *Attorney, Agent, or Firm* — Westman, Champlin & Koehler, P.A.

(57) ABSTRACT

The embodiments of the present disclosure provide a display panel and a display apparatus. The display panel includes: a first substrate; a plurality of sub-pixels arranged in an array on the substrate, the plurality of sub-pixels comprising a first type of sub-pixels and a second type of sub-pixels; and at least one data line, each of which is disposed between adjacent columns of sub-pixels of the array and extending along a second direction, an overlapped area of projection of each data line on the first substrate and projection of the first type of sub-pixels on the first substrate has a first width, and an overlapped area of the projection of each data line on the first substrate and projection of the second type of sub-pixels on the first substrate has a second width less than the first width.

17 Claims, 9 Drawing Sheets

(56) References Cited

U.S. PATENT DOCUMENTS

| | | | |
|---|---|---|---|
| 2018/0252974 A1* | 9/2018 | Okita | G02F 1/136227 |
| 2018/0275473 A1* | 9/2018 | Lo | G02F 1/136286 |
| 2019/0155436 A1* | 5/2019 | Jin | G06F 3/0416 |
| 2019/0272783 A1* | 9/2019 | Huang | G09G 3/2074 |
| 2021/0193685 A1* | 6/2021 | Zhu | G02F 1/136286 |
| 2021/0367113 A1* | 11/2021 | Lin | H01L 33/60 |
| 2021/0375979 A1* | 12/2021 | Cok | H01L 33/62 |
| 2021/0405488 A1* | 12/2021 | Su | G02F 1/1368 |
| 2022/0004069 A1* | 1/2022 | Zhang | G02F 1/1368 |

* cited by examiner

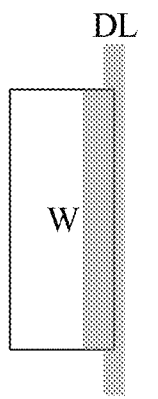 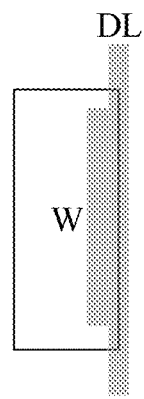 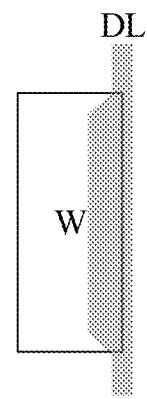
Fig. 5a    Fig. 5b    Fig. 5c
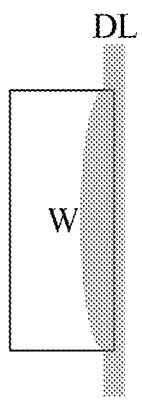 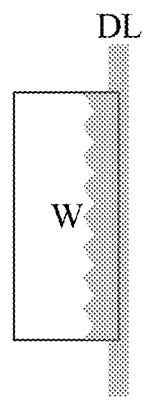 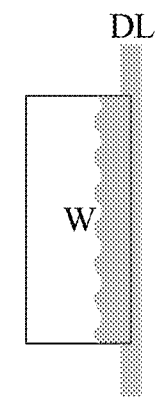
Fig. 5d    Fig. 5e    Fig. 5f

DISPLAY PANEL AND DISPLAY APPARATUS

CROSS-REFERENCE TO RELATED APPLICATION(S)

This application claims priority to the Chinese Patent Application No. 201910856067.8, filed on Sep. 10, 2019, which is incorporated herein by reference in its entirety.

TECHNICAL FIELD

The present disclosure relates to the field of display technology, and more particularly, to a display panel and a display apparatus.

BACKGROUND

In the conventional display technology, sub-pixels of multiple colors, for example, red sub-pixels, green sub-pixels, and blue sub-pixels (hereinafter collectively referred to as RGB sub-pixels), are disposed in a display panel, and picture display is realized by controlling the sub-pixels of different colors. In addition to the original RGB sub-pixels, white sub-pixels are added in the RGBW-type display panel, so as to increase display brightness and reduce power consumption, which, however, reduces picture quality.

SUMMARY

The embodiments of the present disclosure provide a display panel and a display apparatus.

According to an aspect of the embodiments of the present disclosure, there is provided a display panel, comprising:
  a first substrate;
  a plurality of sub-pixels arranged in an array on the first substrate, projection of each of the plurality of sub-pixels on the first substrate has a width in a first direction and a length in a second direction, wherein the first direction is a row direction of the array, the second direction is a column direction of the array, and the plurality of sub-pixels comprise a first type of sub-pixels and a second type of sub-pixels; and
    at least one data line, each of which is disposed between adjacent columns of sub-pixels of the array and extends along the second direction, an overlapped area of a projection of each data line on the first substrate and projection of the first type of sub-pixels on the first substrate has a first width, and an overlapped area of the projection of each data line on the first substrate and projection of the second type of sub-pixels on the first substrate has a second width less than the first width, so that an aperture ratio of the first type of sub-pixels is less than that of the second type of sub-pixels.

In an example, each sub-pixel comprises a pixel electrode and a common electrode, the common electrode is located on the first substrate, the pixel electrode is located on one side of the common electrode away from the first substrate, projection of the respective sub-pixels on the first substrate has the same width and the same length, and the projection of each sub-pixel on the first substrate is axisymmetric with respect to a first symmetric axis of the pixel electrode of the sub-pixel in the first direction and is axisymmetric with respect to a second symmetric axis of the pixel electrode of the sub-pixel in the second direction.

In an example, the display substrate further comprises a first insulating layer and a second insulating layer, the first insulating layer is located between the pixel electrode and the common electrode, the second insulating layer is located between the pixel electrode and the first insulating layer, and the at least one data line is located between the first insulating layer and the second insulating layer.

In an example, a width of projection of pixel electrodes of the first type of sub-pixels on the first substrate is less than that of pixel electrodes of the second type of sub-pixels on the first substrate, and any two of data lines have a same distance between the projection of data line on the first substrate and projection of pixel electrode of a sub-pixel adjacent to the data line on the first substrate, so that the second width is less than the first width.

In an example, the first width is greater than a reference width, the second width is equal to the reference width, and the reference width is in a range from 3 μm to 12 μm.

In an example, the first width is greater than a reference width, the second width is less than the reference width, and the reference width is in a range of 3 μm to 12 μm.

In an example, the first width is equal to a reference width, the second width is less than the reference width, and the reference width is in a range of 3 μm to 12 μm.

In an example, the display panel further comprises a second substrate disposed opposite to the first substrate, wherein a black matrix is disposed on one side of the second substrate facing the first substrate, and protection of the data line on the first substrate is located within projection of the black matrix on the first substrate.

In an example, the first type of sub-pixels comprise non-RGB sub-pixels having a color different from red sub-pixels, green sub-pixels, and blue sub-pixels, and the second type of sub-pixels comprise at least one of red sub-pixels, green sub-pixels, or blue sub-pixels.

In an example, each row of sub-pixels is arranged in an order of red sub-pixel, green sub-pixel, blue sub-pixel, and non-RGB sub-pixel, and adjacent rows of sub-pixels are shifted by two sub-pixels relative to each other, wherein one data line is provided for each column of sub-pixels, so that each non-RGB sub-pixel is adjacent to two data lines in the first direction, and a portion of each of the two data lines which is adjacent to the non-RGB sub-pixel protrudes towards the non-RGB sub-pixel in the first direction.

In an example, a length of the protruding portion of the data lines in the second direction is less than or equal to a length of the non-RGB sub-pixel in the second direction.

In an example, each row of sub-pixels is arranged in an order of red sub-pixel, green sub-pixel, blue sub-pixel, and non-RGB sub-pixel, and adjacent rows of sub-pixels are shifted by two sub-pixels relative to each other, wherein one data line is provided for each two columns of sub-pixels, so that each non-RGB sub-pixel is adjacent to one data line in the first direction, and a portion of the data line which is adjacent to the non-RGB sub-pixel protrudes towards the non-RGB sub-pixel in the first direction.

In an example, a length of the protruding portion of the data line in the second direction is less than or equal to a length of the non-RGB sub-pixel in the second direction.

In an example, common electrodes of two adjacent sub-pixels located between adjacent data lines are connected to each other.

In an example, the non-RGB sub-pixels comprise at least one of white sub-pixels, yellow sub-pixels, or cyan sub-pixels.

According to another aspect of the embodiments of the present disclosure, there is provided a display apparatus comprising the display panel described above.

According to another aspect of the embodiments of the present disclosure, there is provided a display panel, comprising:

a first substrate;

a plurality of sub-pixels arranged in an array on the first substrate, each sub-pixel comprises a pixel electrode and a common electrode;

at least one data line arranged along a first direction, each data line is disposed between adjacent columns of sub-pixels and extends along a second direction, wherein the first direction is a row direction of the array and the second direction is a column direction of the array, wherein the plurality of sub-pixels comprises red sub-pixels, green sub-pixels, blue sub-pixels, and white sub-pixels, one data line is provided for each column of pixels such that each sub-pixel is adjacent to two data lines in the first direction, wherein there is a first distance in the first direction between a portion of one of two adjacent data lines and a portion of the other of the two adjacent data lines, which are located on opposite sides of white sub-pixel respectively, and there is a second distance in the first direction between a portion of one of two adjacent data lines and a portion of the other of the two adjacent data lines, which are located on opposite sides of red sub-pixel, green sub-pixel, or blue sub-pixel, wherein the first distance is less than the second distance, each of the first distance and the second distance is a distance between edges of the two data lines.

In an example, a width of the pixel electrodes of white sub-pixels in the first direction is less than a width of each of red sub-pixels, green sub-pixels, and blue sub-pixels in the first direction, and any two of sub-pixels have a same distance between pixel electrode of sub-pixel and two data lines adjacent to the sub-pixel.

In an example, each row of sub-pixels is arranged in an order of red sub-pixel, green sub-pixel, blue sub-pixel, and white sub-pixel, and adjacent rows of sub-pixels are shifted by two sub-pixels relative to each other, wherein each white sub-pixel is adjacent to two data lines in the first direction, and a portion of each of the two data lines which is adjacent to the white sub-pixel protrudes towards the white sub-pixel in the first direction.

According to another aspect of the embodiments of the present disclosure, there is provided a display panel, comprising:

a first substrate;

a plurality of sub-pixels arranged in an array on the first substrate, each sub-pixel comprises a pixel electrode and a common electrode;

at least one data line arranged along a first direction, each data line is disposed between adjacent columns of sub-pixels and extends along a second direction, wherein the first direction is a row direction of the array and the second direction is a column direction of the array, wherein the plurality of sub-pixels comprises red sub-pixels, green sub-pixels, blue sub-pixels, and white sub-pixels, one data line is provided for each two columns of pixels such that each sub-pixel is adjacent to one data line in the first direction, wherein each white sub-pixel has a first distance between a geometric center of the pixel electrode of the white sub-pixel and an edge of the data line adjacent to the white sub-pixel, and each of the red sub-pixel, green sub-pixel, and blue sub-pixel has a second distance between a geometric center of the pixel electrode of said each of the red sub-pixel, green sub-pixel, and blue sub-pixel and an edge of the data line adjacent to said each of the red sub-pixel, green sub-pixel, and blue sub-pixel.

In an example, a width of the pixel electrodes of white sub-pixels in the first direction is less than a width of each of red sub-pixels, green sub-pixels, and blue sub-pixels in the first direction, and any two of sub-pixels have a same distance between pixel electrode of sub-pixel and two data lines adjacent to the sub-pixel.

In an example, each row of sub-pixels is arranged in an order of red sub-pixel, green sub-pixel, blue sub-pixel, and white sub-pixel, and adjacent rows of sub-pixels are shifted by two sub-pixels relative to each other, wherein each white sub-pixel is adjacent to one data line in the first direction, and a portion of said one data line which is adjacent to the white sub-pixel protrudes towards the white sub-pixel in the first direction.

In an example, common electrodes of two adjacent sub-pixels between two adjacent data lines are connected with each other.

BRIEF DESCRIPTION OF THE ACCOMPANYING DRAWINGS

FIGS. 5a, 5b, 5c, 5d, 5e, and 5f illustrate partial enlarged views of a display panel according to an embodiment of the present disclosure.

Figure 6:
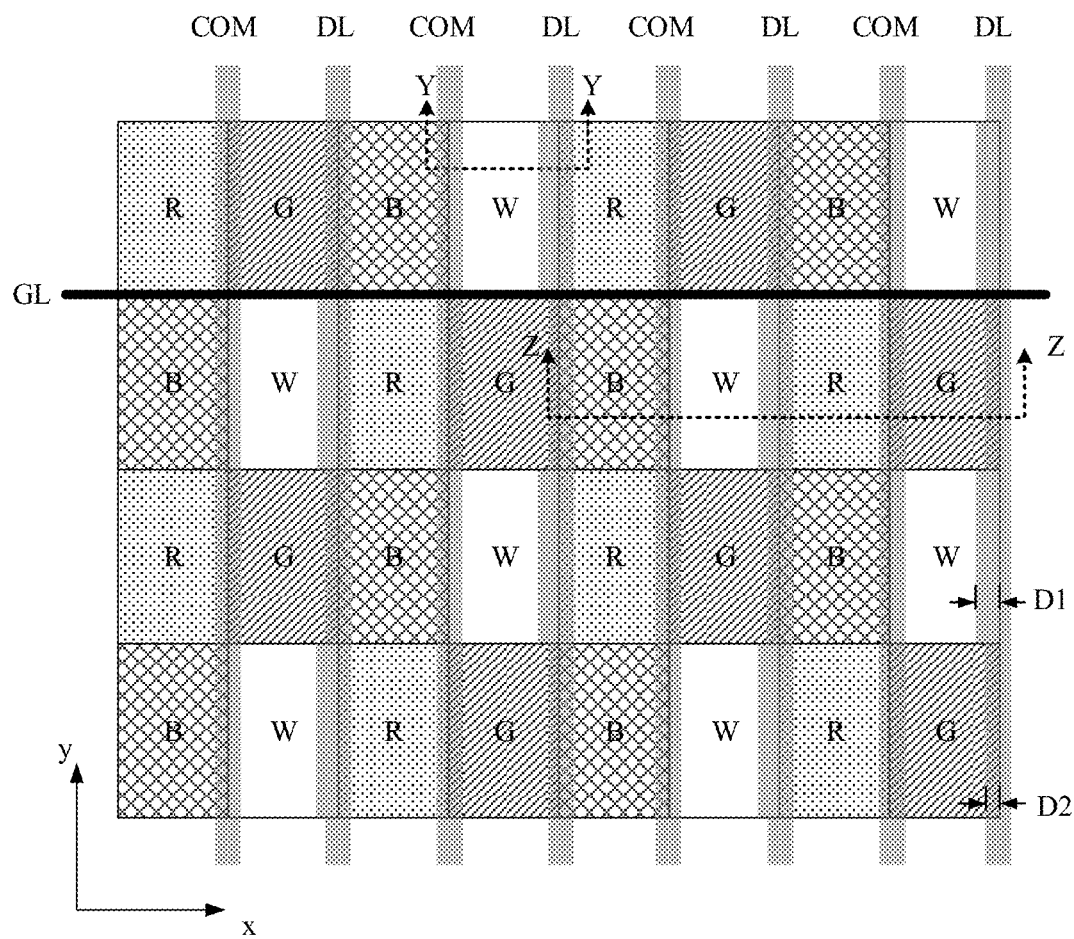

FIG. 6 illustrates a schematic structural diagram of a display panel according to another embodiment of the present disclosure.

Figure 7A:
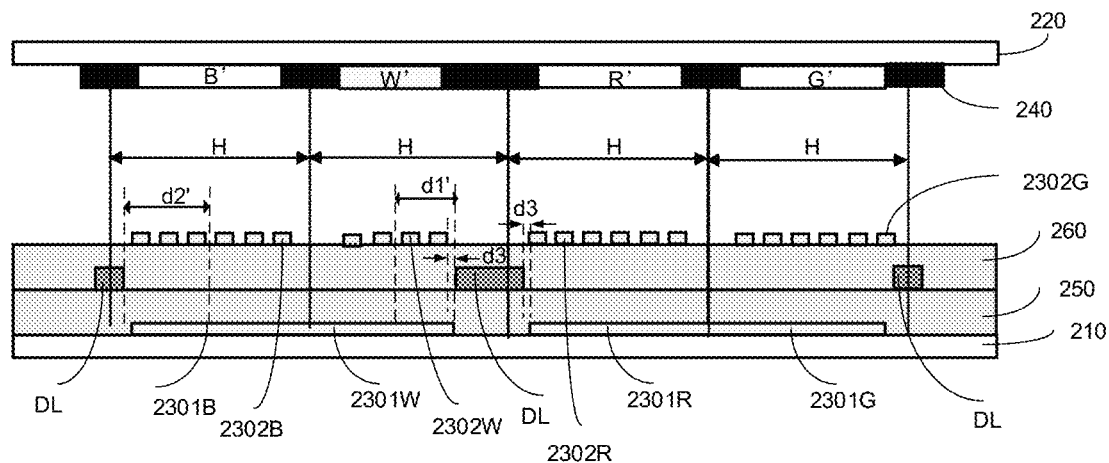

FIG. 7a illustrates a cross-sectional view of an example of the display panel of FIG. 6 along Z-Z line.

Figure 7B:
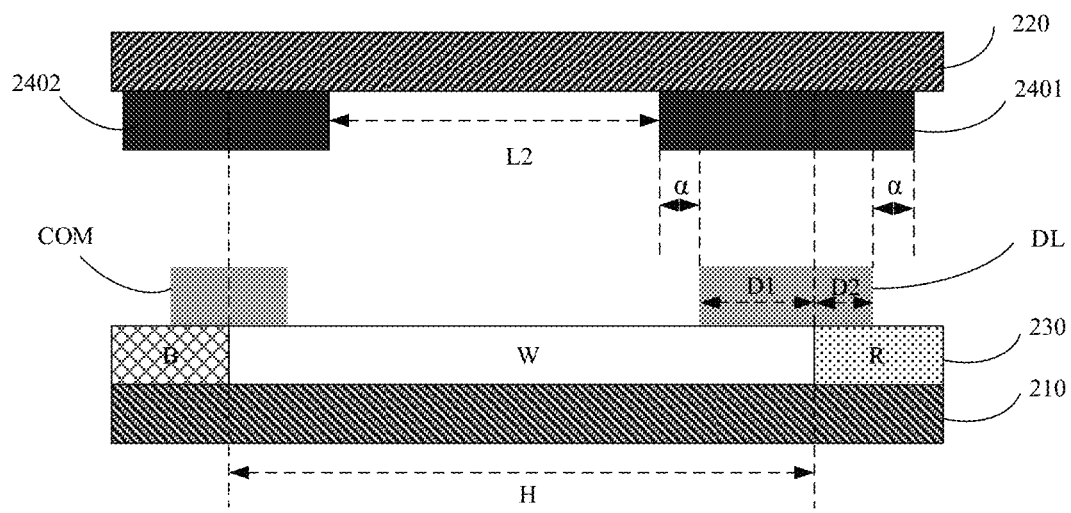

FIG. 7b illustrates a cross-sectional view of an example of the display panel of FIG. 6 along Y-Y line.

Figure 8:
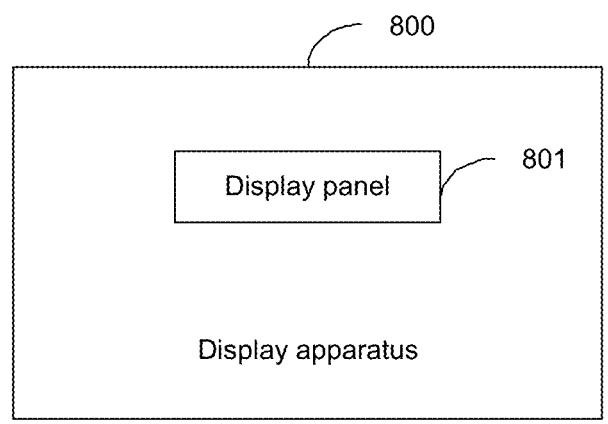

FIG. 8 illustrates a schematic block diagram of a display apparatus according to an embodiment of the present disclosure.

DETAILED DESCRIPTION

In order to make the purposes, technical solutions, and advantages of the embodiments of the present disclosure more clear, the technical solutions in the embodiments of the present disclosure will be described clearly and completely in conjunction with the accompanying drawings in the embodiments of the present disclosure. Obviously, the embodiments described are a part of the embodiments of the present disclosure, instead of all the embodiments of the present disclosure. All other embodiments obtained by those of ordinary skill in the art based on the described embodiments of the present disclosure without any creative work fall within the protection scope of the present disclosure. It should be illustrated that throughout the accompanying drawings, the same elements are denoted by the same or similar reference signs. In the following description, some specific embodiments are for descriptive purposes only, and should not be construed as limiting the present disclosure, but are merely examples of the embodiments of the present disclosure. The conventional structure or configuration will be omitted when it may cause confusion to the understanding of the present disclosure. It should be illustrated that shapes and sizes of components in the figures do not reflect true sizes and proportions, but only illustrate contents of the embodiments of the present disclosure.

Unless otherwise defined, the technical terms or scientific terms used in the embodiments of the present disclosure should have a common meaning understood by those skilled in the art. The terms "first", "second" and similar words used in the embodiments of the present disclosure do not indicate any order, quantity or importance, but are only used to distinguish different components.

Figure 1:
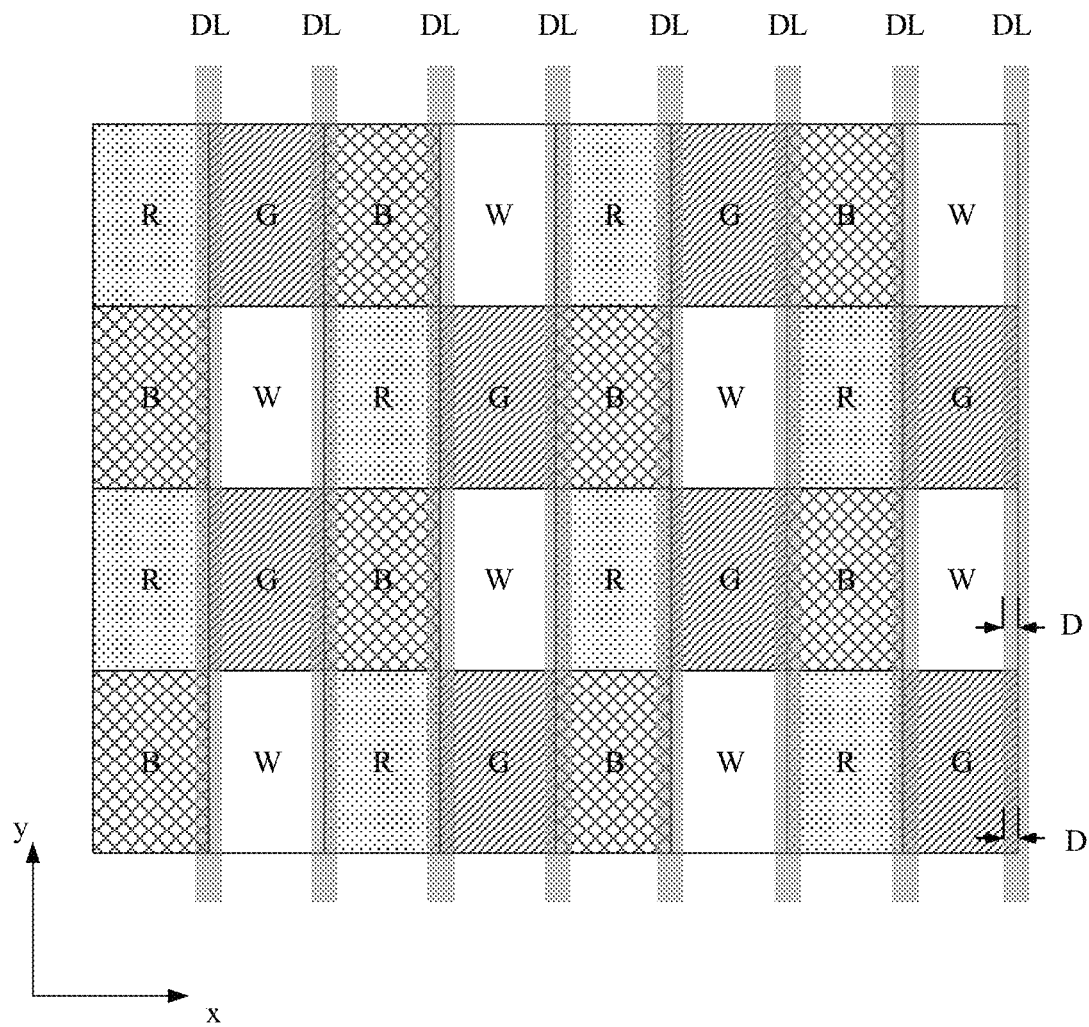
FIG. 1 illustrates a schematic structural diagram of an RGBW display panel.

FIG. 1 illustrates a schematic structural diagram of an RGBW display panel. As shown in FIG. 1, the display panel 100 comprises red sub-pixels R, green sub-pixels G, blue sub-pixels B (hereinafter collectively referred to as RGB sub-pixels), and white sub-pixels W arranged in an array. A plurality of data lines DL are disposed between respective columns of sub-pixels respectively. The sub-pixels R, G, B, and W have substantially the same aperture ratio (that is, a ratio of an area of an effective light transmission area to an overall area), and portions of the data lines DL which cover the respective sub-pixels also have the same width. As shown in FIG. 1, the portions of the data lines which cover the respective sub-pixels have a width D. However, if an aperture ratio of the white sub-pixels W is consistent with those of the RGB sub-pixels, there may be no difference between brightness of the white sub-pixels W and that of the RGB sub-pixels. In practice, this may cause brightness of white sub-pixels of a picture to be too high, which may affect picture quality. For example, when a monochrome picture is displayed, if brightness of white sub-pixels in the picture is too high, the monochromatic picture may not reach a desired purity level, and if the brightness of the white sub-pixels in the picture is too high, an overall color temperature of the picture may be relatively high, and so on.

The embodiments of the present disclosure propose a display panel and a display apparatus. Data lines DL are designed to have different widths for different sub-pixels, so that an aperture ratio of a part of the sub-pixels may be different from that of another part of the sub-pixels, for example, an aperture ratio of the white sub-pixels W is lower than that of the RGB sub-pixels, thereby improving the picture quality.

Figure 2A:
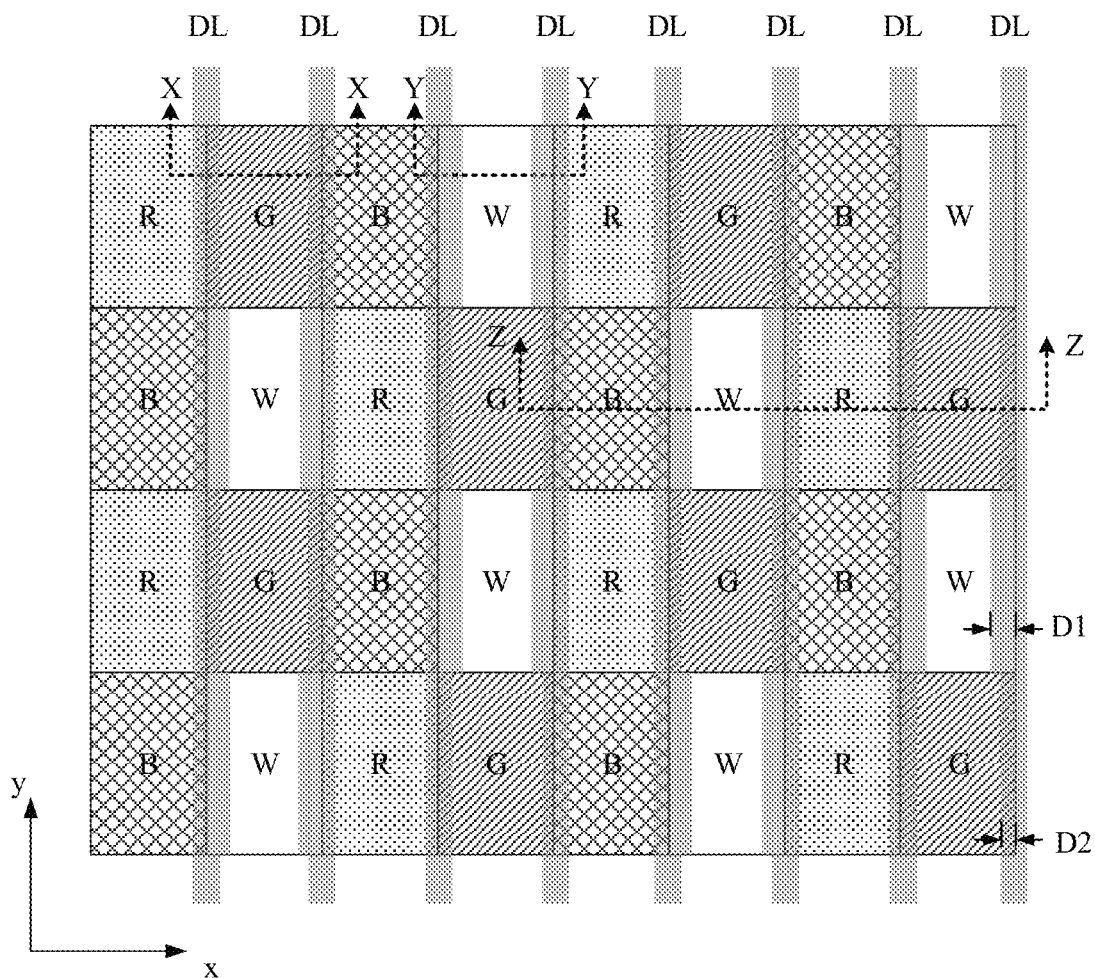
FIG. 2a illustrates a schematic structural diagram of a display panel according to an embodiment of the present disclosure.
Figure 2B:
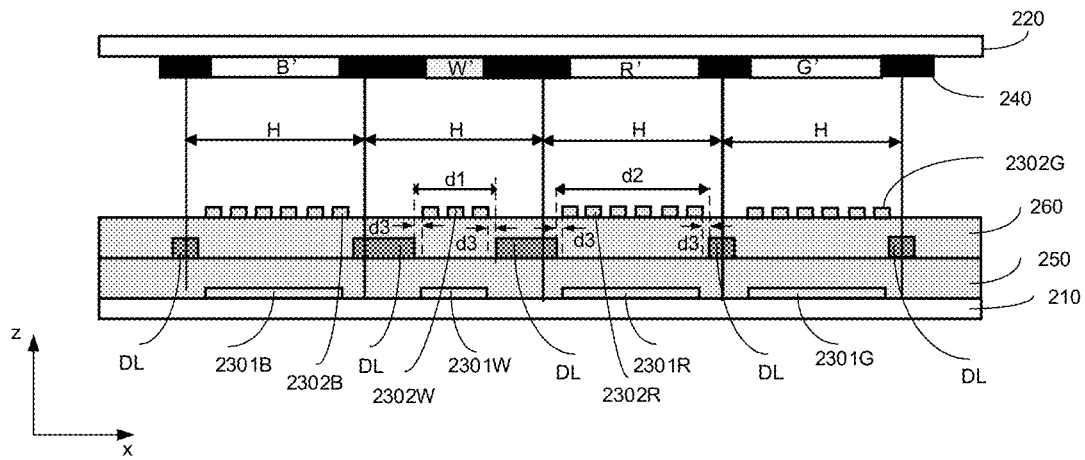
FIG. 2b illustrates a cross-sectional view of the display panel of FIG. 2 along line YY.
Figure 2C:
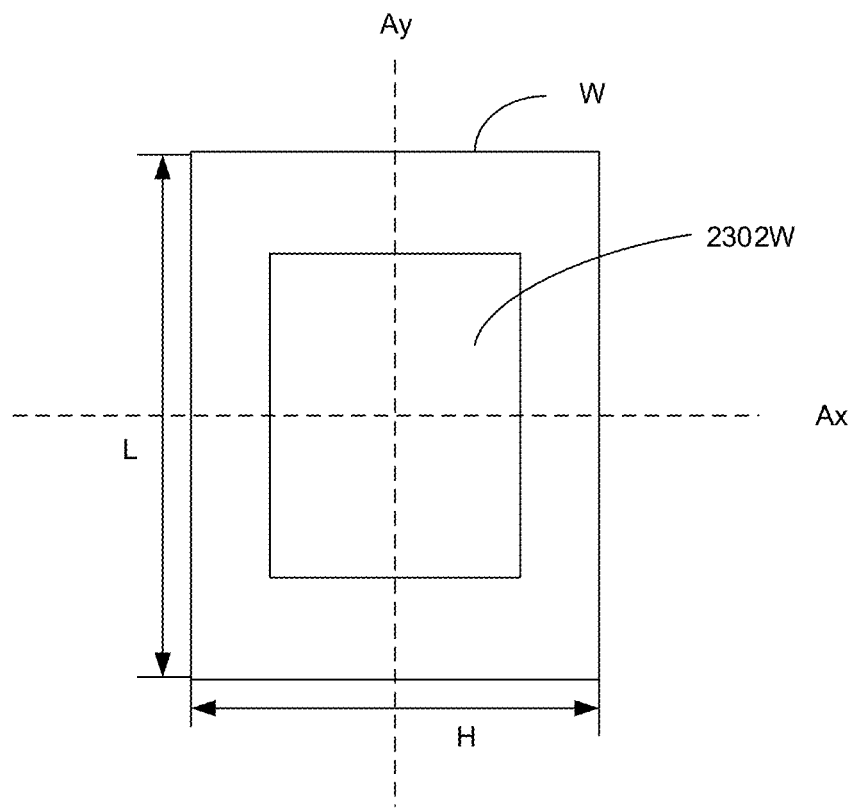
FIG. 2c illustrates a diagram of sizes of sub-pixels of a display panel according to an embodiment of the present disclosure.

FIG. 2a illustrates a schematic structural diagram of a display panel according to an embodiment of the present disclosure. FIG. 2b illustrates a cross-sectional view of the display panel of FIG. 2 along line YY. FIG. 2c illustrates a diagram of sizes of sub-pixels of a display panel according to an embodiment of the present disclosure.

As shown in FIGS. 2a to 2c, the display panel 200 comprises a first substrate 210 and a plurality of sub-pixels arranged in an array on the first substrate 210. In the figures, x represents a row direction (a first direction) of the array, and y represents a column direction (a second direction) of the array. The plurality of sub-pixels comprise a first type of sub-pixels and a second type of sub-pixels. The first type of sub-pixels comprise non-RGB sub-pixels having a color different from red sub-pixels, green sub-pixels, and blue sub-pixels, which comprise, but not limited to, at least one of white sub-pixels, yellow sub-pixels, or cyan sub-pixels, and the second type of sub-pixels comprise, but not limited to, at least one of red sub-pixels, green sub-pixels, and blue sub-pixels. For example, in FIGS. 2a and 2b, the first type of sub-pixels comprise the white sub-pixels W, and the second type of sub-pixels comprise the red sub-pixels R, the green sub-pixels G, and the blue sub-pixels B.

Each sub-pixel comprises a pixel electrode and a common electrode. For example, a blue sub-pixel comprises a common electrode 2301B and a pixel electrode 2302B. The common electrode 2301B is located on the first substrate 210, and the pixel electrode 2302B is located on one side of the substrate 210 away from the common electrode 2301B. Similarly, a white sub-pixel comprises a common electrode 2301W and a pixel electrode 2302W, a red sub-pixel comprises a common electrode 2301R and a pixel electrode 2302R, and a green sub-pixel comprises a common electrode 2301G and a pixel electrode 2302G. Hereinafter, pixel electrodes of the respective sub-pixels are collectively referred to as pixel electrodes 2302, and common electrodes of the respective sub-pixels are collectively referred to as common electrodes 2301. In some embodiments, the sub-pixel further comprises a driving transistor, which is connected to one of the common electrode and the pixel electrode to provide a data voltage thereto, thereby performing display driving.

Projection of each sub-pixel (for example, the white sub-pixel W in FIG. 2c) on the first substrate has a width H in the first direction and a length L in the second direction. A first symmetric axis of the projection of each sub-pixel on the first substrate with respect to the pixel electrode of the sub-pixel in the first direction and a second symmetric axis of the projection of the sub-pixel on the first substrate with respect to the pixel electrode of the sub-pixel in the second direction are axisymmetric. For example, in FIG. 2c, a first symmetric axis Ax of the projection of the white sub-pixel W on the first substrate with respect to the pixel electrode 2302W of the white sub-pixel W in the first direction x and a second symmetric axis Ay of the projection of the white sub-pixel W on the first substrate with respect to the pixel electrode of the white sub-pixel W in the second direction y are axisymmetric. In FIGS. 2a and 2b, projections of the respective sub-pixels R, G, B, and W on the first substrate 210 have the same width H and the same length L.

The display panel 200 further comprises at least one data line DL. Each data line DL is disposed between adjacent columns of sub-pixels of the array and extends along the second direction. An overlapped area of projection of each data line DL on the first substrate 210 and projection of the first type of sub-pixels (for example, the white sub-pixels W) on the first substrate 210 has a first width D1, an overlapped area of the projection of each data line on the first substrate 210 and projection of the second type of sub-pixels (for example, the red sub-pixels R, the green sub-pixels G, and the blue sub-pixels B) on the first substrate 210 has a second width D2 less than the first width D1, so that an aperture ratio of the first type of sub-pixels is less than that of the second type of sub-pixels For example, at least one data line DL is disposed between columns of sub-pixels of the array and partially covers the columns of sub-pixels. Each of the data lines DL may extend in a column direction of the array, and a width of a portion of the data line DL which covers the first type of sub-pixels (the white sub-pixels W in FIG. 2a) is different from that of a portion of the data line DL which covers the second type of sub-pixels (the RGB sub-pixels in FIG. 2a), so that an aperture ratio of the first type of sub-pixels is less than that of the second type of sub-pixels. In some embodiments, the width of the portion of the data line which covers the first type of sub-pixels and the width of the portion of the data line which covers the second type of sub-pixels may be set so that the aperture ratio of the first type of sub-pixels is 10% to 50% less than that of the second type of sub-pixels, that is, the aperture ratio of the first type of sub-pixels may be 50% to 90% of the aperture ratio of the second type of sub-pixels. The so-called data line "covering" the sub-pixels herein refers to overlapping of the projection of the data line on the first substrate and projection of the sub-pixels on the first substrate. Herein, a width of a certain portion may refer to a width of the portion in a direction perpendicular to an extending direction of the data line, and a length of a certain portion may refer to a length of the portion along the extending direction of the data line. For example, in FIG. 2a, for each of the white sub-pixels W, a portion of a data line DL on the left of the white sub-pixel W which covers the white sub-pixel W extends to the right, and a portion of a data line DL on the right of the white sub-pixel W which covers the white sub-pixel W extends to the left, so that the portions of the data lines DL on the left and right of the white sub-pixel W which cover the white sub-pixel W have a first width D1, and portions of a data line DL which cover the RGB sub-pixels has a second width D2, wherein D1>D2. Thereby, the aperture ratio of the white sub-pixels W is less than that of the RGB sub-pixels.

As shown in FIG. 2b, the display substrate further comprises a first insulating layer 250 and a second insulating layer 260, the first insulating layer 250 is located between the pixel electrode 2302 and the common electrode 2301, the second insulating layer 260 is located between the pixel electrode 2302 and the first insulating layer 250, and the at least one data line DL is located between the first insulating layer 250 and the second insulating layer 260. A width of projection of pixel electrodes of the first type of sub-pixels on the first substrate is less than that of pixel electrodes of the second type of sub-pixels on the first substrate. For example, in FIG. 2b, a width of projection of pixel electrodes 2302W of the white sub-pixels W on the first substrate 210 is less than that of pixel electrodes of each of the red sub-pixels R, the green sub-pixels G, and the blue sub-pixels B on the first substrate. In FIG. 2b, two adjacent data lines DL has a first distance d1 between portions of the two adjacent data lines which are located on opposite sides of the white sub-pixel W in the x direction. Two adjacent data lines DL has a second distance d2 between portions of the two adjacent data lines which are located on opposite sides of each of the red sub-pixel W, green sub-pixel G, and blue sub-pixel B, wherein d1 is less than d2, each of the first distance d1 and the second distance d2 is a distance between edges of the two data lines. There is a third distance d3 between the pixel electrode 2302 of each sub-pixel and the two data lines DL adjacent to the sub-pixel in the first direction. The third distance d3 may be the same for all the sub-pixels.

Distances between the projection of each data line DL on the first substrate 210 and projection of pixel electrodes of sub-pixels adjacent to the data line on the first substrate 210 may be equal, for example, the white sub-pixel W in FIG. 2b is adjacent to two data lines DL, wherein a data line DL on the left is also adjacent to a blue sub-pixel, and a data line DL on the right is also adjacent to a red sub-pixel. In the x direction, distances between the data line DL located between the blue sub-pixel and the white sub-pixel and the pixel electrode 2302B and the pixel electrode 2302W may be equal. Similarly, in the x direction, distances between the data line DL located between the white sub-pixel and the red sub-pixel and the pixel electrode 2302W and the pixel electrode 2302R may be equal. Since the width of the pixel electrode 2301W of the white sub-pixel is less than those of the pixel electrode 2301B of the blue sub-pixel and the pixel electrode 2301R of the red sub-pixel, the first width D1 of the portion of the data line DL which covers the white sub-pixel W is greater than the second width D2 of the portion of the data line DL which covers the red sub-pixel or the blue sub-pixel.

In FIG. 2a, each row of sub-pixels is disposed in an order of red sub-pixel R, green sub-pixel G, blue sub-pixel B, and white sub-pixel W, and adjacent rows of sub-pixels are shifted by two sub-pixels relative to each other, wherein one data line is provided for each columns of sub-pixels, so that the white sub-pixels W are adjacent to two data lines DL in the first direction, and a portion of the two data lines DL which is adjacent to the white sub-pixels protrudes towards the white sub-pixels in the first direction (the x direction). A length of the protruding portion of the data lines DL in the second direction (the y direction) may be less than or equal to the length L of the white sub-pixels in the second direction.

The structure of the display panel of the embodiment of the present disclosure will be further described below with reference to FIGS. 3 to 4c. It should be noted that FIGS. 3 to 4c are intended to illustrate the size and positional relationship between the data line and the sub-pixel, and do not limit the specific layered structure of the sub-pixel and the data line.

Figure 3:
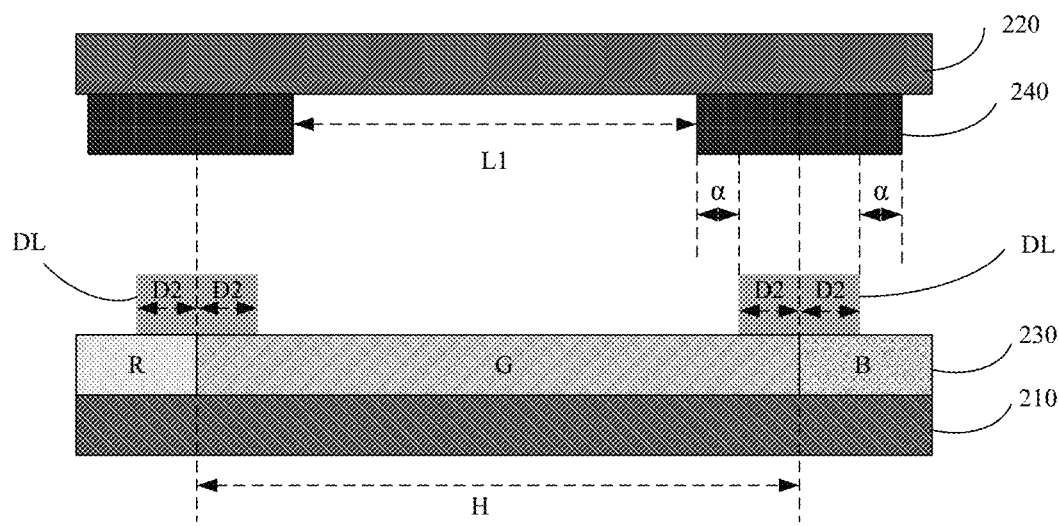
FIG. 3 illustrates a cross-sectional view of an example of the display panel of FIG. 2 along line X-X.

FIG. 3 illustrates a cross-sectional view of an example of the display panel of FIG. 2a along line X-X. As shown in FIG. 3, the display panel comprises a first substrate 210 and a second substrate 220 disposed opposite to each other. An array 230 of a plurality of sub-pixels (a red sub-pixel R, a green sub-pixel G, and a blue sub-pixel B are shown in FIG. 3) are disposed on the first substrate 210. In FIG. 3, each sub-pixel (for example, the green sub-pixel G) has a width H, one data line DL (for example, a data line DL on the left in FIG. 3) is disposed between the red sub-pixel R and the green sub-pixel G and partly covers the red sub-pixel R and the green sub-pixel G, and another data line DL (for example, a data line on the right in FIG. 3) is disposed between the green sub-pixel G and the blue sub-pixel B and partially covers the green sub-pixel G and the blue sub-pixel B. Portions of the two data lines which cover the red sub-pixel R, the green sub-pixel G, and the blue sub-pixel B in FIG. 3 all have a width D2.

A black matrix 240 is disposed on one side of the second substrate 220 facing the first substrate 210, and projection of the data line DL on the first substrate 210 is located within projection of the black matrix 240 on the first substrate. In FIG. 3, projection of the black matrix 240 and the data line DL below the black matrix 240 on the first substrate 210 has a width difference a on both the left and right sides. In this way, a portion of each sub-pixel (for example, the green sub-pixel in FIG. 3) is not blocked by the black matrix 240, thereby forming an effective light transmission area. As shown in FIG. 3, the effective light transmission area has a width L1, wherein L1=H−2D2.

Figure 4A:
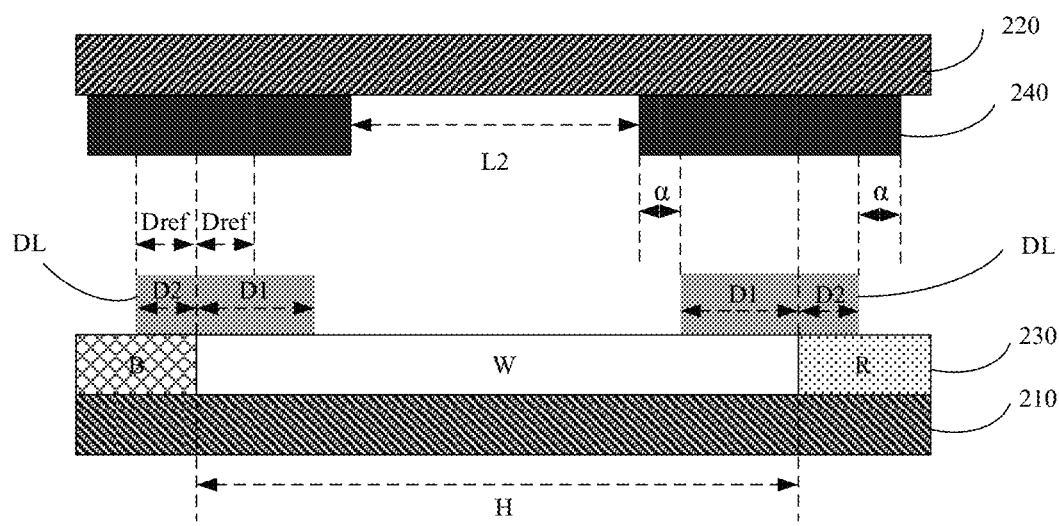
FIG. 4a illustrates a cross-sectional view of an example of the display panel of FIG. 2 along line Y-Y.

FIG. 4a illustrates a cross-sectional view of an example of the display panel of FIG. 2a along line Y-Y. As shown in FIG. 4a, the display panel comprises a first substrate 210 and a second substrate 220 disposed opposite to each other.

An array 230 of a plurality of sub-pixels (a blue sub-pixel B, a white sub-pixel W, and a red sub-pixel R are shown in FIG. 4a) are disposed on the first substrate 210. In FIG. 4a, each sub-pixel (for example, the white sub-pixel W) has a width H, one data line DL (for example, a data line DL on the left in FIG. 4a) is disposed between the blue sub-pixel B and the white sub-pixel W and partially covers the blue sub-pixel B and the white sub-pixel W, and another data line DL (for example, a data line on the right in FIG. 4a) is disposed between the white sub-pixel W and the red sub-pixel R and partially covers the white sub-pixel W and the red sub-pixel R. In FIG. 4a, portions of the data lines DL which cover the white sub-pixel W have a width D1, and portions of the data lines DL which cover the blue sub-pixel B and the red sub-pixel R both have a width D2. The first width D1 is greater than a reference width Dref, and the second width D2 is equal to the reference width Dref. The reference width Dref may be in a range of 3 μm to 12 μm. A length and a shape of the portions of the data lines DL which cover the white sub-pixel W may be set as required without affecting aperture ratios of sub-pixels of other colors around the white sub-pixel W.

A black matrix 240 is disposed on one side of the second substrate 220 facing the first substrate 210, and projection of the data line DL on the first substrate 210 is located within projection of the black matrix 240 on the first substrate. Similarly to FIG. 3, projection of the black matrix 240 and the data line DL below the black matrix 240 on the first substrate 210 has a width difference a on both the left and right sides. In this way, a portion of each sub-pixel which is not covered by the black matrix 240 forms an effective light transmission area. As shown in FIG. 4a, an effective light transmission area of the white sub-pixel W has a width L2, wherein L2=H−2α−2D1.

The width D of the portions of the data lines DL which cover the respective sub-pixels as shown in FIG. 1 may be used as the reference width Dref for comparison with FIG. 4a. It may be seen that, as compared with the data lines DL in FIG. 1, a width of the portions of the data lines DL which cover the white sub-pixel W in FIG. 4a is increased (from Dref to D1), so that a width of the effective light transmission area of the white sub-pixel W is decreased (to the width L2). In this way, an area of the effective light transmission area of the white sub-pixel W is decreased in a case of the same length, thereby reducing an aperture ratio of the white sub-pixel W. As compared with the data lines DL in FIG. 1, a width of the portions of the data lines DL which cover the RGB sub-pixels remains unchanged (D2=Dref), so that a width of the effective light transmission area of the RGB sub-pixels remains unchanged (the width L2 is the same as a width of an effective light transmission area of the RGB sub-pixels in FIG. 1), and thereby the aperture ratio of the RGB sub-pixels remains unchanged. In this way, the aperture ratio of the white sub-pixel W is lower than that of the RGB sub-pixels, thereby reducing the influence of the white sub-pixel W on the picture quality, and achieving a compromise between the picture quality and the light transmittance of the panel. In addition, as compared with the reference width of Dref, since the width of the portions of the data lines DL which cover the white sub-pixel W in FIG. 4a is increased while the width of the remaining portions remains unchanged, this reduces resistance of the data lines DL and may reduce loads of the data lines.

Figure 4B:
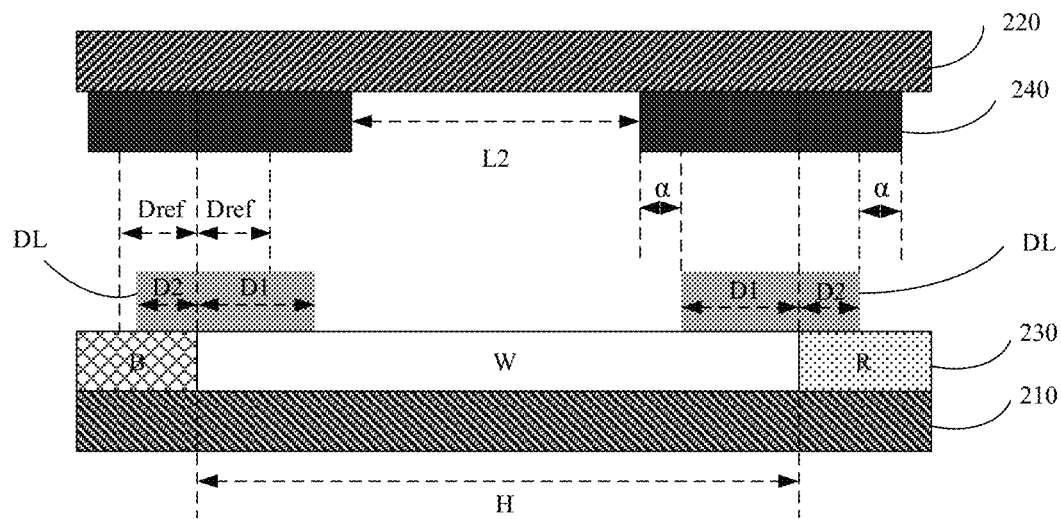
FIG. 4b illustrates a cross-sectional view of another example of the display panel of FIG. 2 along line Y-Y.
Figure 4C:
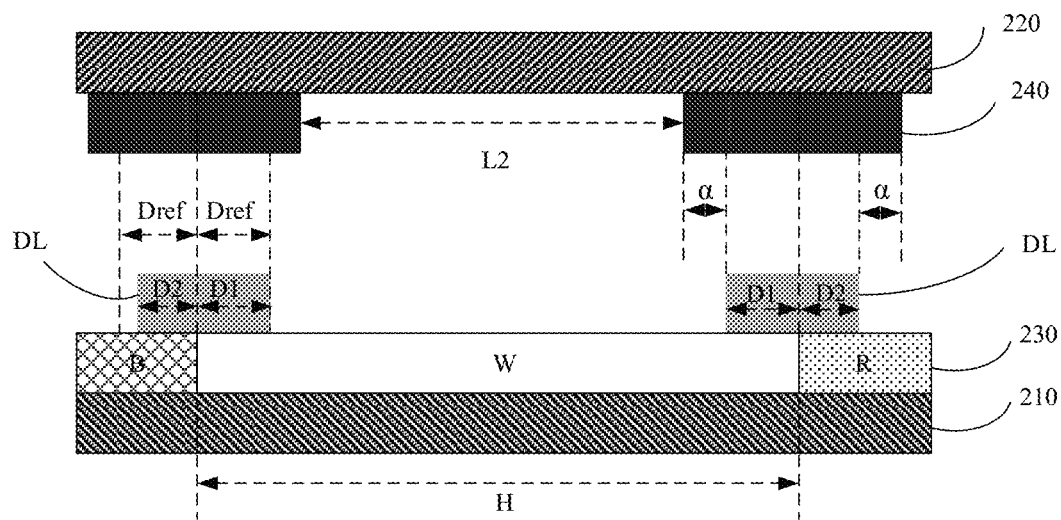
FIG. 4c illustrates a cross-sectional view of yet another example of the display panel of FIG. 2 along line Y-Y.

FIG. 4b illustrates a cross-sectional view of another example of the display panel of FIG. 2a along line Y-Y. The display panel of FIG. 4b is similar to that of FIG. 4a, at least except for the design of the width of the data lines DL. For brevity, the difference will be mainly described in detail below.

As shown in FIG. 4b, the portions of the data lines DL which cover the white sub-pixel W have a first width D1, and the portions of the data lines which cover the RGB sub-pixels have a second width D2, wherein the first width D1 is greater than the reference width Dref, and the second width D2 is less than the reference width Dref.

Similarly, the width D of the portions of the data lines DL which cover the respective sub-pixels as shown in FIG. 1 is used as the reference width Dref for comparison with FIG. 4b. It may be seen that, as compared with the data lines DL in FIG. 1, the width of the portions of the data lines DL which cover the white sub-pixel W in FIG. 4b is increased (from Dref to D1), which reduces an area of the effective light transmission area of the white sub-pixel W, thereby reducing the aperture ratio of the white sub-pixel W, and the width of the portions of the data lines DL which cover the RGB sub-pixels is decreased. In this way, the aperture ratio of the white sub-pixel W is lower than that of the RGB sub-pixels, thereby reducing the influence of the white sub-pixel W on the picture quality, and achieving a compromise between the picture quality and the light transmittance of the panel. In addition, as compared with the reference width Dref, since the width of the portions of the data lines DL which cover the white sub-pixel W in FIG. 4b is increased while the width of the portions of the data lines DL which cover the RGB sub-pixels is decreased, resistance of the data lines DL may be the same as that of the data lines DL when the portions of the data lines DL which cover the respective sub-pixels all have the reference width Dref (for example, when a structure of the data lines as shown in FIG. 1 is used), thereby keeping the loads of the data lines unchanged.

FIG. 4c illustrates a schematic structural diagram of a display panel according to another embodiment of the present disclosure. The display panel of FIG. 4c is similar to that of FIG. 4a, at least except for the design of the width of the data lines DL. For brevity, the difference will be mainly described in detail below.

As shown in FIG. 4c, portions of the respective data lines DL which cover the white sub-pixel W have a first width D1, and portions of the data lines DL which cover the RGB sub-pixels have a second width D2, wherein the first width D1 is equal to the reference width Dref, and the second width D2 is less than the reference width Dref.

Similarly, the width D of the portions of the data lines DL which cover the respective sub-pixels as shown in FIG. 1 is used as the reference width Dref for comparison with FIG. 4c. It may be seen that, as compared with the data lines DL having the reference width Dref in FIG. 1, the width of the portions of the data lines DL which cover the white sub-pixel W in FIG. 4c remains unchanged, so that the aperture ratio of the white sub-pixel W remains unchanged, while the width of the portions of the data lines DL which cover the RGB sub-pixels is decreased. In this way, the aperture ratio of the white sub-pixel W is lower than that of the RGB sub-pixels, thereby reducing the influence of the white sub-pixel W on the picture quality, and achieving a compromise between the picture quality and the light transmittance of the panel. In addition, as compared with the reference width Dref, since the width of the portions of the data lines DL which cover the white sub-pixel W in FIG. 4c remains unchanged while the width of the portions of the data lines DL which cover the RGB sub-pixels is decreased, this may cause the resistance of the data lines DL to be greater than that of the data lines DL when the portions of the data lines DL which cover the respective sub-pixels all have the reference width Dref. In a case of ensuring that a charging rate of the data lines DL is at a desired level, this method may be used to improve the picture quality.

FIGS. 5a, 5b, 5c, 5d, 5e, and 5f (hereinafter collectively referred to as FIG. 5) illustrate partial enlarged views of a display panel according to an embodiment of the present disclosure, in which a shape of a portion of a data line which cover a white sub-pixel W is illustrated. The partial enlarged views of FIG. 5 are applicable to any of the embodiments described above with reference to FIGS. 2a to 4c. As shown in FIG. 5, in the display panel, the portion of the data line DL which covers the white sub-pixel W may have a rectangular shape (as shown in FIG. 5a), a stepped shape (as shown in FIG. 5b), a trapezoidal shape (as shown in FIG. 5c), a curved shape (as shown in FIG. 5d), a Zigzag shape (as shown in FIG. 5e) or a wavy shape (as shown in FIG. 5f), and an edge on one side (the right side in FIG. 5) of the portion of the data line DL, which covers the white sub-pixel W, facing other sub-pixels may maintain a straight shape. The embodiments of the present disclosure are not limited thereto, and the portion of the data line DL which covers the white sub-pixel W may be set to have other shapes, for example, an irregular shape, as required. In some embodiments, portions of the data line DL which cover sub-pixels of other colors may also have the above-mentioned shapes or other shapes as required.

In the above embodiments, a single-gate line-type display panel is taken as an example to illustrate the embodiments of the present disclosure, in which one data line DL is disposed for each column of sub-pixels as shown in FIG. 2a. The embodiments of the present disclosure may also be applied to a dual-gate line-type display panel.

As shown in FIG. 6, the display panel 300 has a similar structure to that of FIG. 2a, at least except that the display panel 300 is a dual-gate line-type display panel, in which one data line DL is disposed for every two columns of sub-pixels, so that the non-RGB sub-pixels, which are sub-pixels having a color different from red sub-pixels, green sub-pixels, and blue sub-pixels, (the white sub-pixels W in FIG. 6) are adjacent to one data line DL in the first direction, and a portion of the data line DL which is adjacent to the non-RGB sub-pixels protrudes towards the non-RGB sub-pixels in the first direction. A length of the protruding portion of the data line DL in the y direction is less than or equal to that of the white sub-pixels W in the y direction. The content described above with respect to FIGS. 2a to 5 is also applicable to the display panel 300 of FIG. 6. For example, in FIG. 6, one data line DL is disposed on the right side of every two columns of sub-pixels, and other lines or elements, for example, a common electrode line COM, may be disposed in a boundary region between the two columns of sub-pixels, and a data line DL on the right of each white sub-pixel W partially protrude to the left, so that an aperture ratio of the white sub-pixel W is decreased, thereby improving the picture quality.

In FIG. 6, the display panel 300 further comprises gate lines GL disposed between rows of sub-pixels. For brevity, only one gate line is shown in FIG. 6; however, it should be apparent to those skilled in the art that this is merely illustrative, and a number, a structure, positions, and sizes of the gate lines are not limited thereto. In some embodiments, as shown in FIG. 6, the portion of the data line DL which covers the white sub-pixel W protrudes relative to other portions of the data line DL, so that a width of the portion which covers the white sub-pixel W is greater than that of the other portions. Projection of the protruding portion on the first substrate 210 may not overlap with that of the gate line GL on the first substrate 210, so as to avoid the influence of the protruding portion on signals on the gate line GL. For example, the portion of the data line DL which covers the white sub-pixel W may adopt the shape of FIG. 5b, FIG. 5c, or FIG. 5d to reduce or even avoid the influence of the protruding portion of the data line DL on the gate line GL.

FIG. 7a illustrates a cross-sectional view of an example of the display panel of FIG. 6 along line Z-Z. As shown in FIG. 7a, two columns of sub-pixels are disposed between two adjacent data lines DL, such that each sub-pixel is adjacent to one data line DL in the x direction. In FIG. 7b, there is a first distance d1' between a geometric center of the pixel electrode 2302W of the white sub-pixel W and an edge of the data line DL adjacent to the white sub-pixel W, and there is a second distance d2' between a geometric center of the pixel electrode 2302R, 2302G, 2302B of each of the red sub-pixel R, green sub-pixel G, and blue sub-pixel B and an edge of the data line DL adjacent to said each of the red sub-pixel R, green sub-pixel G, and blue sub-pixel B, wherein the first distance d1' is less than the second distance d2'. The width of the pixel electrode 2302W of the white sub-pixel W in the x direction is less than the width of the pixel electrode 2302R, 2302G, 2302B of each of the red sub-pixel W, green sub-pixel G, and blue sub-pixel B. Each sub-pixel has a same distance d3 between the pixel electrode 2302 of the sub-pixel and the data line DL adjacent to the sub-pixel in the x direction. Common electrodes 2301 of two adjacent sub-pixels located between the adjacent data lines are connected to each other. For example, in FIG. 7a, the common electrode 2301B of the blue sub-pixel and the common electrode 2301W of the white sub-pixel may be connected to each other, for example, may be formed as an integral structure, and the common electrode 2301R of the red sub-pixel and the common electrode 2301G of the green sub-pixel may be connected to each other, for example, may be formed as an integral structure.

FIG. 7b illustrates a cross-sectional view of an example of the display panel of FIG. 6 along Y-Y line. The display panel of FIG. 7b has a structure similar to those of the above display panels of FIG. 4a, FIG. 4b and FIG. 4c, at least except for a common electrode line COM. For brevity, the difference will be mainly described in detail below.

As shown in FIG. 7b, the display panel comprises a first substrate 210, a second substrate 220, a pixel array 230, a data line DL, and a black matrix. In FIG. 7b, the common electrode line COM, instead of a data line, is disposed between a blue sub-pixel B and a white sub-pixel W. The black matrix comprises a portion 2401 located above the data line DL and a portion 2402 located above the common electrode line COM. The data line DL and the portion 2401 of the black matrix above the data line DL may adopt the structures described above with reference to FIGS. 4a, 4b, and 4c, and the common electrode line COM and the portion 2402 of the black matrix above the common electrode line COM may be designed to have any suitable structure and size as required. It may be seen from FIG. 7b that since a width D1 of a portion of the data line DL which covers the white sub-pixel W is greater than a width D2 of a portion of the data line DL which covers the RGB sub-pixels, a width L2 of an effective light transmission area of the white sub-pixel W is less than that of an effective light transmission area of the RGB sub-pixels. Thus, an aperture ratio of the white sub-pixel W is less than that of the RGB sub-pixels, thereby improving the picture quality.

Although a specific sub-pixel arrangement is illustrated as an example in FIGS. 2a to 7b, for example, sub-pixels in each row are arranged in an order of RGBW and a next row of sub-pixels is shifted to the right by two sub-pixels relative to a previous row of sub-pixels, the embodiments of the present disclosure are not limited thereto, and the display panel according to the embodiments of the present disclosure may adopt any other sub-pixel arrangement as required.

FIG. 8 illustrates a schematic block diagram of a display apparatus according to an embodiment of the present disclosure. As shown in FIG. 7b, the display apparatus 800 comprises a display panel 801. The display panel 801 may be implemented using the display panel according to any of the above embodiments. Examples of the display apparatus 800 comprise but are not limited to liquid crystal displays, OLED displays, and other devices having display functions, comprising but not limited to mobile phones, televisions, desktop computers, tablet computers, laptop computers, etc.

It may be understood by those skilled in the art that the embodiments described above are all exemplary, and those skilled in the art may make improvements thereto, and structures described in the various embodiments may be combined randomly without a conflict in terms of structures or principle.

After the preferred embodiments of the present disclosure are described in detail, it may be apparent to those skilled in the art that various changes and changes may be made without departing from the protection scope and spirit of the appended claims, and the present disclosure is not limited to implementations of the exemplary embodiments in the specification.

We claim:

1. A display panel, comprising:
a first substrate;
a plurality of sub-pixels arranged in an array on the first substrate, projection of each of the plurality of sub-pixels on the first substrate has a width in a first direction and a length in a second direction, wherein the first direction is a row direction of the array, the second direction is a column direction of the array, and the plurality of sub-pixels comprise a first type of sub-pixels and a second type of sub-pixels; and
at least one data line, each of which is disposed between adjacent columns of sub-pixels of the array and extends along the second direction, an overlapped area of projection of each data line on the first substrate and projection of the first type of sub-pixels on the first substrate has a first width, and an overlapped area of the projection of each data line on the first substrate and projection of the second type of sub-pixels on the first substrate has a second width less than the first width, so that an aperture ratio of the first type of sub-pixels is less than that of the second type of sub-pixels, wherein each sub-pixel comprises a pixel electrode and a common electrode, the common electrode is located on the first substrate, the pixel electrode is located on one side of the common electrode away from the first substrate, projection of the respective sub-pixels on the first substrate has the same width and the same length, and the projection of each sub-pixel on the first substrate is axisymmetric with respect to a first symmetric axis of the pixel electrode of the sub-pixel in the first direction and is axisymmetric with respect to a second symmetric axis of the pixel electrode of the sub-pixel in the second direction.

2. The display panel according to claim 1, further comprising a first insulating layer and a second insulating layer, the first insulating layer is located between the pixel electrode and the common electrode, the second insulating layer is located between the pixel electrode and the first insulating layer, and the at least one data line is located between the first insulating layer and the second insulating layer.

3. The display panel according to claim 1, wherein a width of projection of pixel electrodes of the first type of sub-pixels on the first substrate is less than that of pixel electrodes of the second type of sub-pixels on the first substrate, and any two of data lines have a same distance between the projection of data line on the first substrate and projection of pixel electrode of a sub-pixel adjacent to the data line on the first substrate, so that the second width is less than the first width.

4. The display panel according to claim 1, further comprising a second substrate disposed opposite to the first substrate, wherein a black matrix is disposed on one side of the second substrate facing the first substrate, and protection of the data line on the first substrate is located within projection of the black matrix on the first substrate.

5. The display panel according to claim 1, wherein the first type of sub-pixels comprise non-RGB sub-pixels having a color different from red sub-pixels, green sub-pixels, and blue sub-pixels, and the second type of sub-pixels comprise at least one of red sub-pixels, green sub-pixels, or blue sub-pixels.

6. The display panel according to claim 5, wherein each row of sub-pixels is arranged in an order of red sub-pixel, green sub-pixel, blue sub-pixel, and non-RGB sub-pixel, and adjacent rows of sub-pixels are shifted by two sub-pixels relative to each other, wherein one data line is provided for each column of sub-pixels, so that each non-RGB sub-pixel is adjacent to two data lines in the first direction, and a portion of each of the two data lines which is adjacent to the non-RGB sub-pixel protrudes towards the non-RGB sub-pixel in the first direction.

7. The display panel according to claim 6, wherein a length of the protruding portion of the data lines in the second direction is less than or equal to a length of the non-RGB sub-pixel in the second direction.

8. The display panel according to claim 5, wherein each row of sub-pixels is arranged in an order of red sub-pixel, green sub-pixel, blue sub-pixel, and non-RGB sub-pixel, and adjacent rows of sub-pixels are shifted by two sub-pixels relative to each other, wherein one data line is provided for each two columns of sub-pixels, so that each non-RGB sub-pixel is adjacent to one data line in the first direction, and a portion of the data line which is adjacent to the non-RGB sub-pixel protrudes towards the non-RGB sub-pixel in the first direction.

9. The display panel according to claim 8, wherein a length of the protruding portion of the data line in the second direction is less than or equal to a length of the non-RGB sub-pixel in the second direction.

10. The display panel according to claim 8, wherein common electrodes of two adjacent sub-pixels located between adjacent data lines are connected to each other.

11. The display panel according to claim 5, wherein the non-RGB sub-pixels comprise at least one of white sub-pixels, yellow sub-pixels, or cyan sub-pixels.

12. A display apparatus comprising the display panel according to claim 1.

13. A display panel, comprising:
a first substrate;
a plurality of sub-pixels arranged in an array on the first substrate, each sub-pixel comprises a pixel electrode and a common electrode;
at least one data line arranged along a first direction, each data line is disposed between adjacent columns of sub-pixels and extends along a second direction, wherein the first direction is a row direction of the array and the second direction is a column direction of the array,
wherein the plurality of sub-pixels comprises red sub-pixels, green sub-pixels, blue sub-pixels, and white sub-pixels, one data line is provided for each column of pixels such that each sub-pixel is adjacent to two data lines in the first direction, wherein there is a first distance in the first direction between a portion of one of two adjacent data lines and a portion of the other of the two adjacent data lines, which are located on opposite sides of white sub-pixel respectively, and there is a second distance in the first direction between a portion of one of two adjacent data lines and a portion of the other of the two adjacent data lines, which are located on opposite sides of red sub-pixel, green sub-pixel, or blue sub-pixel, wherein the first distance is less than the second distance, each of the first distance and the second distance is a distance between edges of the two data lines, wherein a width of the pixel electrodes of white sub-pixels in the first direction is less than a width of each of red sub-pixels, green sub-pixels, and blue sub-pixels in the first direction, and any two of sub-pixels have a same distance between pixel electrode of sub-pixel and two data lines adjacent to the sub-pixel.

14. The display panel according to claim 13, wherein each row of sub-pixels is arranged in an order of red sub-pixel, green sub-pixel, blue sub-pixel, and white sub-pixel, and adjacent rows of sub-pixels are shifted by two sub-pixels relative to each other, wherein each white sub-pixel is adjacent to two data lines in the first direction, and a portion of each of the two data lines which is adjacent to the white sub-pixel protrudes towards the white sub-pixel in the first direction.

15. A display panel, comprising:
a first substrate;
a plurality of sub-pixels arranged in an array on the first substrate, each sub-pixel comprises a pixel electrode and a common electrode;
at least one data line arranged along a first direction, each data line is disposed between adjacent columns of sub-pixels and extends along a second direction, wherein the first direction is a row direction of the array and the second direction is a column direction of the array,
wherein the plurality of sub-pixels comprises red sub-pixels, green sub-pixels, blue sub-pixels, and white sub-pixels, one data line is provided for each two columns of pixels such that each sub-pixel is adjacent to one data line in the first direction, wherein each white sub-pixel has a first distance between a geometric center of the pixel electrode of the white sub-pixel and an edge of the data line adjacent to the white sub-pixel, and each of the red sub-pixel, green sub-pixel, and blue sub-pixel has a second distance between a geometric center of the pixel electrode of said each of the red sub-pixel, green sub-pixel, and blue sub-pixel and an edge of the data line adjacent to said each of the red sub-pixel, green sub-pixel, and blue sub-pixel, wherein a width of the pixel electrodes of white sub-pixels in the first direction is less than a width of each of red sub-pixels, green sub-pixels, and blue sub-pixels in the first direction, and any two of sub-pixels have a same distance between pixel electrode of sub-pixel and two data lines adjacent to the sub-pixel.

16. The display panel according to claim 15, wherein each row of sub-pixels is arranged in an order of red sub-pixel, green sub-pixel, blue sub-pixel, and white sub-pixel, and adjacent rows of sub-pixels are shifted by two sub-pixels relative to each other, wherein each white sub-pixel is adjacent to one data line in the first direction, and a portion of said one data line which is adjacent to the white sub-pixel protrudes towards the white sub-pixel in the first direction.

17. The display panel according to claim 15, wherein common electrodes of two adjacent sub-pixels between two adjacent data lines are connected with each other.

* * * * *